(12) United States Patent
Mizutani et al.

(10) Patent No.: US 7,553,608 B2
(45) Date of Patent: Jun. 30, 2009

(54) RESIST PATTERN FORMING METHOD INCLUDING UNIFORM INTENSITY NEAR FIELD EXPOSURE

(75) Inventors: Natsuhiko Mizutani, Tokyo (JP); Yasuhisa Inao, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/102,152

(22) Filed: Apr. 14, 2008

(65) Prior Publication Data

US 2008/0199817 A1 Aug. 21, 2008

Related U.S. Application Data

(62) Division of application No. 10/842,451, filed on May 11, 2004, now Pat. No. 7,374,844.

(30) Foreign Application Priority Data

May 12, 2003 (JP) ............................. 2003-132517

(51) Int. Cl.
*G03F 7/20* (2006.01)
*G03F 7/40* (2006.01)
(52) U.S. Cl. ...................... 430/311; 430/313
(58) Field of Classification Search ................ 430/311, 430/313
See application file for complete search history.

(56) References Cited

U.S. PATENT DOCUMENTS

| 6,171,730 B1 | 1/2001 | Kuroda et al. ............... 430/5 |
| 6,187,482 B1 | 2/2001 | Kuroda et al. ............... 430/5 |
| 6,236,033 B1 | 5/2001 | Ebbesen et al. ............ 250/216 |
| 6,285,020 B1 | 9/2001 | Kim et al. ................. 250/216 |
| 6,628,392 B2 | 9/2003 | Kuroda et al. .............. 356/400 |
| 6,720,115 B2 | 4/2004 | Inao et al. .................. 430/5 |
| 2001/0036581 A1 | 11/2001 | Inao et al. ............... 430/5 |

(Continued)

FOREIGN PATENT DOCUMENTS

JP 2001-133618 5/2001

OTHER PUBLICATIONS

Weast, et al. *CRC Handbook of Chemistry and Physics*, CRC Press, Inc., 61$^{st}$ Ed., 1980, pp. E-392, E-393.

*Primary Examiner*—Mark F Huff
*Assistant Examiner*—John Ruggles
(74) *Attorney, Agent, or Firm*—Fitzpatrick, Cella, Harper & Scinto

(57) ABSTRACT

A resist pattern forming method includes preparing a photomask for generating near-field light having an intensity distribution. The photomask has a light-transmissible base member, and a light-blocking film. The film has a micro-aperture adapted to expose an object to near-field light seeping out from the micro-aperture. The photomask has a periodic structure and a shift of a phase. The shift exists between recesses or projections adjacent to the micro-aperture. A difference in the intensity distribution of the near-field light in the area of the aperture is reduced. The photomask is arranged close to a photoresist film on a substrate. Light from a light source irradiates the photoresist film by way of the photomask to form a latent image based on the micro-aperture, and the photoresist film is developed to form a resist pattern on the substrate based on the latent image.

4 Claims, 9 Drawing Sheets

U.S. PATENT DOCUMENTS

| | | | |
|---|---|---|---|
| 2002/0196420 A1 | 12/2002 | Naya | 355/71 |
| 2003/0211403 A1 | 11/2003 | Mizutani et al. | 430/5 |
| 2003/0232257 A1 | 12/2003 | Inao et al. | 430/5 |
| 2004/0227917 A1 | 11/2004 | Mizutani et al. | 355/53 |
| 2006/0003236 A1 | 1/2006 | Mizutani et al. | 430/5 |

RESIST PATTERN FORMING METHOD INCLUDING UNIFORM INTENSITY NEAR FIELD EXPOSURE

This application is a divisional application of U.S. patent application Ser. No. 10/842,451, filed May 11, 2004, now U.S. Pat. No. 7,374,844 issued May 20, 2008.

This application also claims priority from Japanese Patent application No. 2003-132517 filed on May 12, 2003, the entire contents of which is hereby incorporated by reference herein.

BACKGROUND OF THE INVENTION

1. Field of the Invention

This invention relates to a photomask for exposure to an optical near-field, to a method of controlling an optical near-field intensity distribution using such a photomask, to a pattern preparing method, and also to a pattern preparing apparatus.

2. Related Background Art

With the current advancement of technology brought forth to realize semiconductor memories having a higher memory capacity and CPUs that operate at a very high speed, and show an enhanced degree of integration, photolithography is inevitably required to accommodate micro-processing operations with smaller dimensions. Generally, the dimensional limit of micro-processing of a photolithography apparatus approximately corresponds to the wavelength of the light source to be used for photolithography. Therefore, a near-ultraviolet laser is often used as a light source for a photolithography apparatus in order to reduce the dimensional limit. Thus, currently, photolithography apparatuses are feasible for micro-processing on the order of about 0.1 μm.

While the dimensional limit of micro-processing is reduced for photolithography, there are still a number of problems to be solved for photolithography if it is to be used for micro-processing of 0.1 μm and less. For example, a light source having a shorter wavelength may be needed. Then, lenses that can be used for such a short wavelength may have to be developed.

Near-field exposure methods have been proposed as a possible solution for these problems. For example, U.S. Pat. No. 6,171,730 proposes an exposure method and an exposure apparatus that utilize an elastically deformable mask having a micro-aperture pattern of an opening with a width not greater than 100 nm on the front surface and made of an elastic material so as to be deformable along the normal line relative to the mask surface. The method and the apparatus as disclosed in the above-cited patent document are excellent, and have contributed greatly to the technological field to which the present invention relates.

However, when g-rays having a wavelength of 436 nm or i-rays having a wavelength of 365 nm are used for a micro-aperture pattern with a width not greater than 100 nm, as disclosed in U.S. Pat. No. 6,171,730, the width of the openings is less than one half of the wavelength.

In an operation of near-field exposure using a near-field formed by light by way of a micro-aperture in a metal film, the optical near-field intensity distribution can be different from the contour of the aperture.

Meanwhile, U.S. Pat. No. 6,236,033 proposes a photolithography mask formed having a metal film with an aperture and a surface profile that undulates periodically so as to interact with surface plasmon modes and intensifies the transmission of light through the aperture for the purpose of transferring an image. However, while the above-cited patent proposes to boost light obtained through the aperture, it does not propose to weaken light and make uniform the intensity distribution of light.

SUMMARY OF THE INVENTION

The present invention provides a photomask for exposure to an optical near-field, a method of controlling an optical near-field intensity distribution using such a photomask, a pattern preparing method and also a pattern preparing apparatus, as will be described hereinafter.

In an aspect of the invention, there is provided a photomask for exposure to an optical near-field having a micro-aperture and adapted to expose an object of exposure to light by using light seeping out from the micro-aperture, the mask having periodically arranged recesses or projections so as to make uniform the optical near-field intensity distribution in the micro-aperture.

For the purposes of the invention, the aperture width of the micro-aperture may be not greater than one-half of the wavelength of light from the light source.

For the purpose of the invention, the optical near-field intensity distribution may be controlled by way of the positions and/or sizes of the recesses or projections relative to the micro-aperture.

The recesses or projections may be arranged periodically relative to the micro-aperture and the optical near-field intensity distribution may be controlled by way of the extent of shift of the pitch and/or the phase of the period.

The pitch of the period may be made shorter than the intra-medium wavelength of the light used for the exposure within the mask base member of the photomask.

For the purpose of the invention, it may be so arranged that the micro-aperture includes a micro-aperture group of a plurality of micro-apertures and the photomask has the recesses or projections in the vicinity of an area of a weak optical near-field intensity that is produced when light for exposure is applied in the micro-aperture group.

Alternatively, it may be so arranged that the micro-aperture includes a micro-aperture group of a plurality of micro-apertures and the photomask has the recesses or projections in the vicinity of an area of a strong optical near-field intensity that is produced when light for exposure is applied in the micro-aperture group.

For the purposes of the invention, it may be so arranged that the micro-aperture includes a micro-aperture group of a plurality of micro-apertures and the photomask has at least a first recess or a projection in the vicinity of an area of a weak optical near-field intensity that is produced when light for exposure is applied in the micro-aperture group, the first recess or projection and the second recess or projection being different from each other in terms of relative position and/or size relative to the micro-aperture.

Still, alternatively, it may be so arranged that the micro-aperture includes a micro-aperture group of a plurality of micro-apertures and the photomask has first recesses or projections arranged periodically in the vicinity of an area of a weak optical near-field intensity that is produced when light for exposure is applied in the micro-aperture group and second recesses or projections arranged periodically in the vicinity of an area of a strong optical near-field intensity that is produced when light for exposure is applied in the micro-aperture group, the first recess or projection and the second recess or projection being different from each other in terms of the pitch and/or phase of period.

For the purposes of the invention, it may be so arranged that the micro-aperture is slit-shaped and the photomask has the area of a weak optical near-field intensity in the vicinity of each of the ends of the slit-shaped micro-aperture, the recess or projection being formed in the vicinity of each of the ends of the slit-shaped micro-aperture.

For the purposes of the invention, it may be so arranged that the micro-aperture shows an isolated pattern having a longitudinal dimension and a transversal dimension smaller than the wavelength, and the area of weak optical near-field intensity is located in the vicinity of the isolated pattern, whereas the recess or projection is formed in the vicinity of the isolated pattern.

For the purposes of the invention, it may be so arranged that the phase of the period forms a discontinued section in the periodically arranged recesses or projections and the discontinued section is arranged in the vicinity of the micro-aperture.

For the purposes of the invention, it may be so arranged that the micro-aperture includes a micro-aperture group of a plurality of micro-apertures and the photomask is provided with a first periodic structure having a discontinued section in the phase of the period in the vicinity of an area of a weak optical near-field intensity that is produced when light for exposure is applied in the micro-aperture group and a second periodic structure having a discontinued section in the phase of a period in the vicinity of an area of a strong optical near-field intensity that is produced when light for exposure is applied in the micro-aperture group, the amount of discontinuation of phase being different between the first periodic structure and the second periodic structure.

In another aspect of the present invention, there is provided a method of controlling an optical near-field intensity distribution using a photomask for exposure to an optical near-field according to the invention and adapted to control the intensity distribution of the optical near-field according to the invention and adapted to control the intensity distribution of the optical near-field by adjusting the coupled relation of light being propagated through the micro-aperture and plasmon polaritons on the surface of the photomask.

In still another aspect of the invention, there is provided a pattern preparing method comprising arranging a photomask for exposure to an optical near-field on a substrate to be processed, the substrate carrying a photoresist film thereon with a thickness not greater than the wavelength of light from a light source, irradiating light for exposure from the light source onto the photoresist film by way of the photomask, and forming/transferring a latent image on the photoresist film on the basis of the aperture pattern formed in the photomask by controlling the intensity distribution of the optical near-field.

In still another aspect of the invention, there is provided a pattern preparing apparatus comprising a stage adapted to carry thereon a photomask for exposure to an optical near-field according to the invention, a light source for exposure, a specimen table adapted to carry thereon a substrate to be processed, the substrate carrying a photoresist film thereon with a thickness not greater than the wavelength of light from the light source, and a distance control means for controlling the distance between the substrate to be processed and the photomask.

Thus, according to the invention, it is possible not only to control the intensity distribution of the optical near-field, at will, but it is also possible to provide a photomask for exposure to an optical near-field that can control the intensity distribution so as to make it uniform, a method of controlling the intensity distribution of an optical near-field by using such a photomask, a pattern preparing method and a pattern preparing apparatus.

DESCRIPTION OF THE PREFERRED EMBODIMENTS

Now, the present invention will be described in greater detail by referring to the accompanying drawings.

First Embodiment

Figure 1:
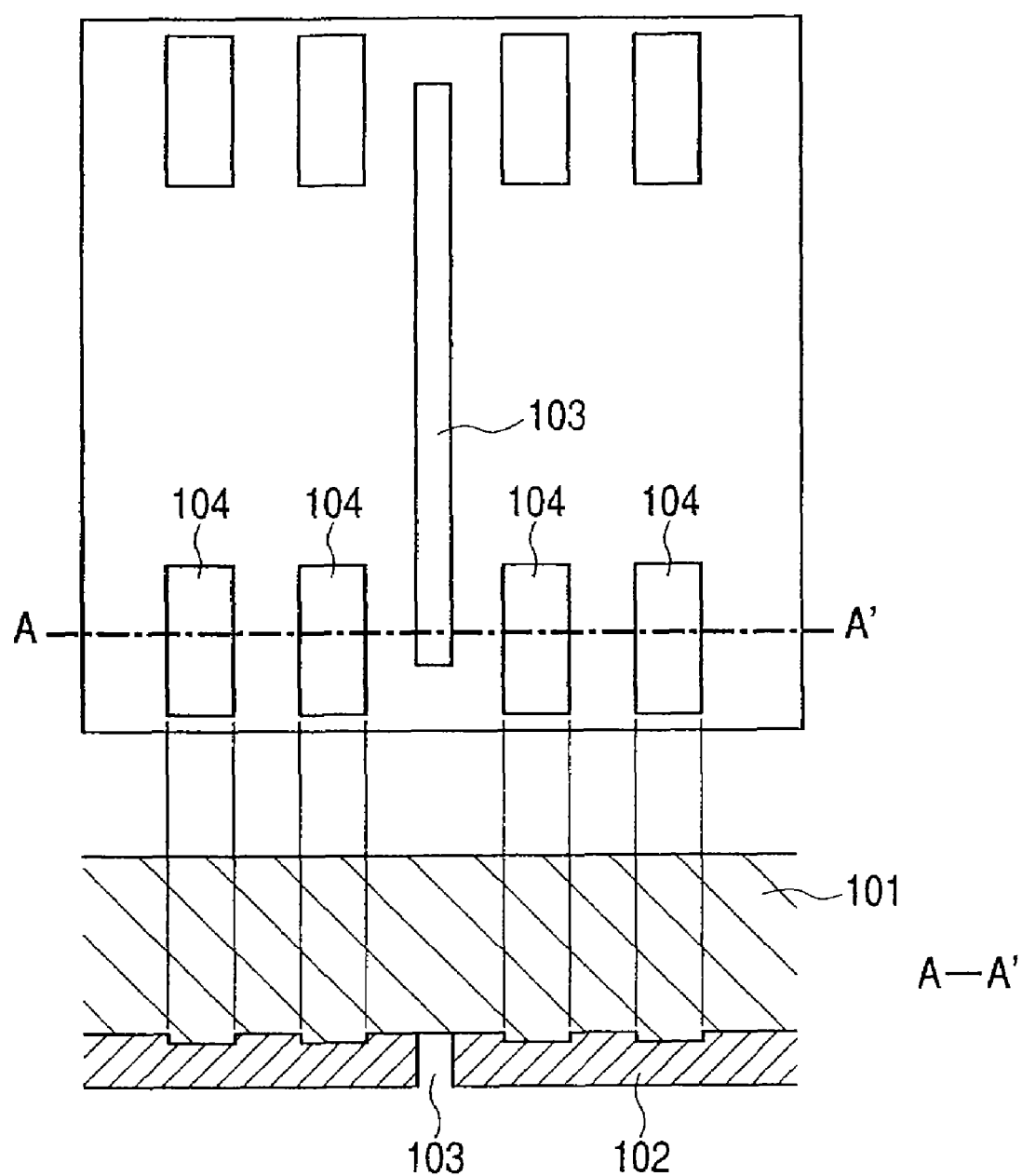
FIG. 1 is a schematic illustration of the first embodiment of a photomask for exposure to an optical near-field according to the invention.

FIG. 1 is an enlarged partial view of the first embodiment of a photomask for exposure to an optical near-field according to the invention. The photomask comprises a base member 101 that is transparent relative to the wavelength of light from a light source to be used for exposure and a metal thin film 102 that blocks light from the light source. The thin film has a thickness between 40 and 200 nm.

The base member 101 is also a thin film having a thickness between 0.1 and 100 μm that is supported along the outer peripheral section thereof by a support member (not shown). The metal thin film 102 has a slit-shaped aperture 103. The width of the slit is smaller than half of the wavelength of light from the light source, whereas the length of the slit is greater than the wavelength of light from the light source.

Recesses/projections 104 are formed periodically in the vicinity of each of the ends of the slit of the metal film 102 in a direction perpendicular to the longitudinal direction of the slit (in the direction of AA' in FIG. 1).

The mask is made to tightly adhere to the thin film resist applied to a substrate. Then, light is irradiated onto it in a direction perpendicular to it so that the pattern is exposed to light. Now, the behavior of light in the vicinity of the mask will be discussed in detail below.

When light for exposure is irradiated onto the mask from the side of the base member, an optical near-field is produced in the vicinity of the aperture on the front surface of the mask (the surface at the lower side in the cross-sectional view of FIG. 1).

The periodic recesses/projections 104 at each of the ends of the slit of this embodiment are designed to boost the intensity of light at a part of the slit located near the recesses/projections, so as to minimize the difference in the optical near-field intensity over the entire area of the mask aperture and to realize a quasi-flat light intensity distribution pattern.

The distributed optical near-field is weak in the vicinity of each of the ends of the slit when there are no periodic recesses/projections 104, for the reason described below.

Assume that light is irradiated onto the mask of FIG. 1 without controlling polarization of the light. The incident light can be divided into a parallel component whose electrical field vector is parallel to the slit and a perpendicular component whose electrical field vector is perpendicular to the slit. The slit does not allow the component of light whose electrical field vector is parallel to the slit (and, hence, parallel to the metal surfaces, or the lateral surfaces, of the slit) to pass through it. On the other hand, the component of light whose electrical field vector is perpendicular to the slit is propagated through the slit and produces an optical near-field on the front surface of the mask. However, the propagation loss of light is increased in the slit, because the electrical field vector runs parallel with the metal surface at each of the ends of the slit. Such a loss affects the range from the ends of the slit to the wavelength of light from the light source.

The concept of controlling the intensity of light by means of periodic recesses/projections 104 arranged near the slit is based on the principle as described below. The periodic recesses/projections 104 control coupling of interface plasmon polaritons and light that is being propagated through the slit on the surface of the metal film (the interface of the metal film and the base member or the interface of the photoresist and the metal film when the metal film tightly adheres to the photoresist).

More specifically, interface plasmon polaritons are scattered by the periodic recesses/projections to give rise to a standing wave. The intensity of an optical near-field is boosted if the position of the slit is found near a local maximum of the standing wave, whereas it is weakened if the position of the slit is found near a local minimum of the standing wave.

This effect will be described further by way of specific numeral computation models, as shown in FIGS. 5A through 5H. Chromium (Cr, complex refractive index; 1.775-4.035i) is used as a metal, and a value of 436 nm is assumed for the wavelength in a vacuum of light from a light source. For the purpose of simplicity, two-dimensional models where the refractive index of the base member is equal to one, and the slit has an infinite length, are used.

Figure 5A:
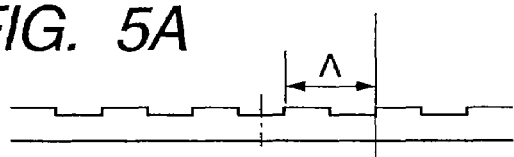
FIGS. 5A, 5B, 5C, 5D, 5E, 5F, 5G and 5H are numerical computation models of an optical near-field in a near-field micro-aperture produced by periodically arranged recesses and projections provided for the purpose of explaining the first embodiment of the invention.
Figure 5E:
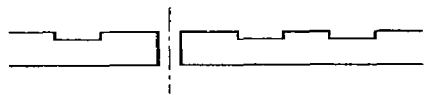
Figure 5B:
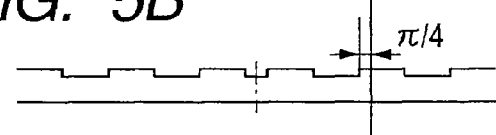
Figure 5F:
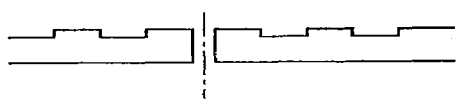
Figure 5C:
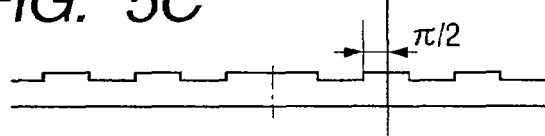
Figure 5G:
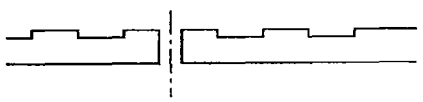

First, two parameters of the pitch $\Lambda$ and the phase $\Phi$ of recesses/projections that are used for describing the profile of periodic recesses/projections in a case wherein there is no slit will be explained by referring to FIGS. 5A through 5D. A slit is to be arranged along the dotted chain line in each of FIGS. 5A through 5D. However, the phase and the pitch are defined on the basis of the profile of the recesses/projections before arranging a slit. The pitch $\Lambda$ is the distance for a period of a recess and a projection, as shown in FIG. 5A. Phase $\Phi=0$ is defined for the periodic structure of FIG. 5A where the phase does not show any discontinuity at the axis of symmetry and the latter is the center of a recess. On the other hand, phase $\Phi=\pi/4$ is defined for the periodic structure of FIG. 5B, phase $\Phi=\pi/2$ defined for that of FIG. 5C, and phase $\Phi=\pi$ is defined for that of FIG. 5D.

Figure 5D:
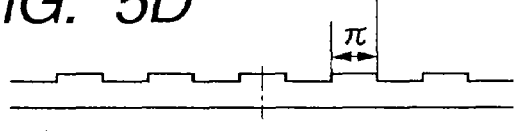
Figure 5H:
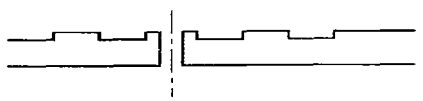

While the phase $\Phi$ is equal to $\pi$ also at the left side of the slit, and there is no discontinuity of phase in the periodic recesses/projections of FIG. 5D, the periodic structure of FIG. 5D differs from that of FIG. 5A in terms of phase.

FIGS. 5E through 5H show periodic structures where a slit is arranged at the axis of symmetry and correspond, respectively, to FIGS. 5A through 5D. Note, however, that the recess where the slit is arranged is buried in each of FIGS. 5E and 5F. Two recesses are arranged at each side of the slit.

Then, light is irradiated onto the structure form the side where the recesses are formed periodically, and the intensity distribution of an optical near-field is determined by numerical analysis, using the FDTD method. The slit has a width of 80 nm and the light shielding film has a thickness of 60 nm.

Figure 6:
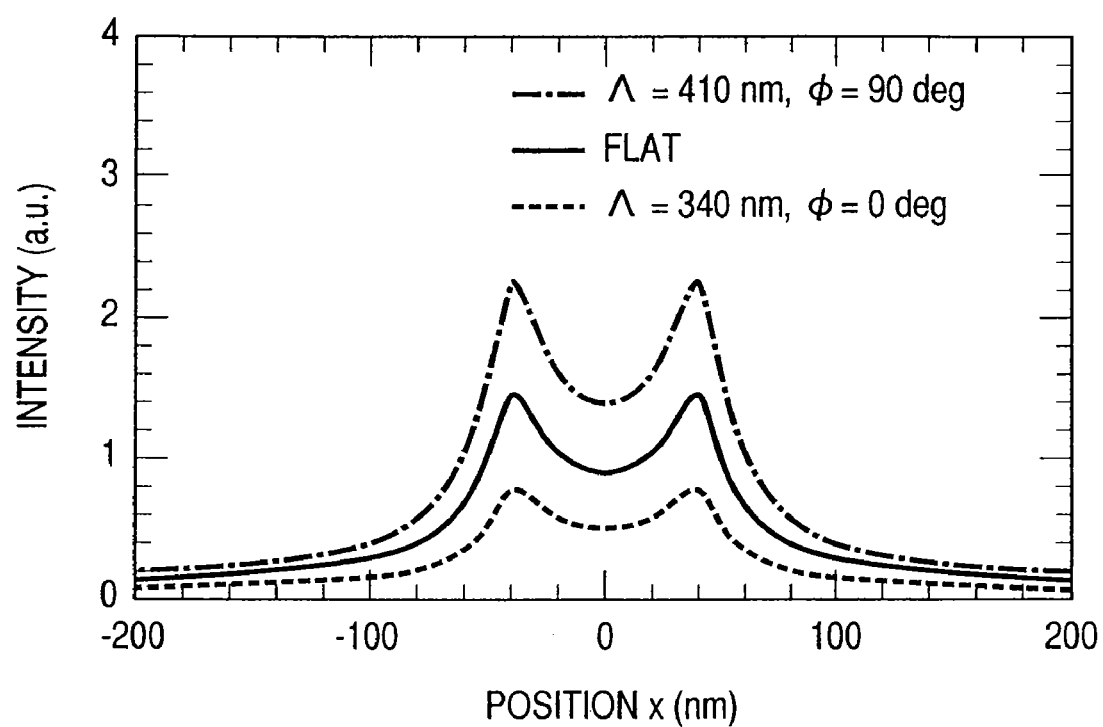
FIG. 6 is a graph obtained by computationally determining the intensity distribution of an optical near-field provided for the purpose of explaining the first embodiment of the invention.

FIG. 6 shows the computationally obtained values of the intensity of light (a squared amplitude of the electrical field) at positions separated from the mask surface by 10 nm. In FIG. 6, the solid line indicates the intensity distribution of an optical near-field when no periodic recesses are arranged. It is provided as a reference for comparison. On the other hand, the intensity of light is increased by about 1.5 times relative to the reference value when recesses are arranged periodically with a pitch of $\Lambda=410$ nm and a phase of $\Phi=\pi/2$ (dotted chain line), whereas it is reduced to about 0.6 times relative to the reference value when recesses are arranged periodically with a pitch of $\Lambda=340$ nm and a phase of $\Phi=0$ (broken line). The pitch that is used to increase the intensity of light is close to the wavelength of surface plasmons along the vacuum/Cr interface, or $$\lambda spp = \lambda_0 [(\in_m + \in_d)/(\in_m \times \in_d)]^{1/2} = 428.4 \text{ nm},$$

but does not completely agree with the latter. In the above formula, $\in_m$ represents the dielectric constant of Cr and $\in_d$ represents the dielectric constant of the dielectric substance involved (e.g., a vacuum in the computation models).

Figure 7:
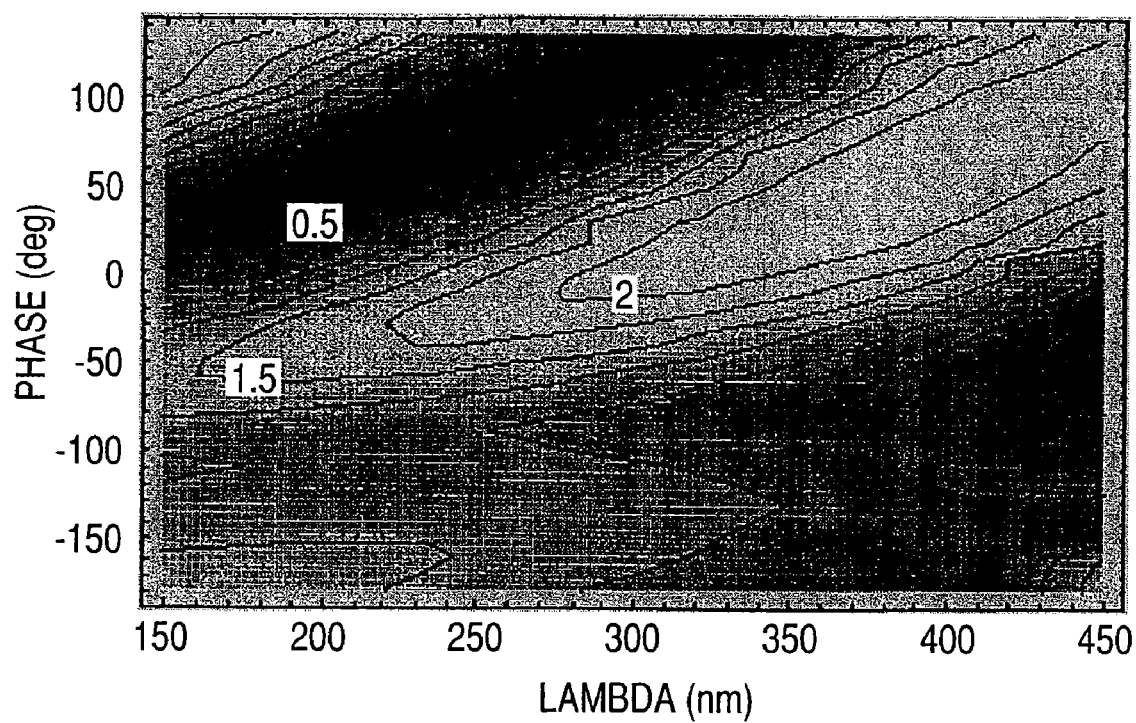
FIG. 7 is a contour graph illustrating the pitch lambda (nm) of the periodic structure and the intensity of light immediately below the aperture, relative to the phase, as provided for the purpose of explaining the first embodiment of the invention.

FIG. 7 is a contour graph illustrating the pitch lambda (nm) of the periodic structure, as shown in any of FIGS. 5E through 5H, and the intensity of light immediately below the aperture relative to the phase (deg), where the intensity of light is made equal to one when there is no periodic structure. As in the case of the numerical computation models of FIGS. 5E through 5H, chromium (Cr, complex refractive index; 1.775-4.035i) is used as a metal, and a value of 436 nm is assumed for the wavelength in a vacuum of light from a light source. Again, for the purpose of simplicity, two-dimensional models where the refractive index of the base member is equal to one, and the slit has an infinite length, are used.

For the effect of intensifying an optical near-field by means of periodic recesses/projections, as used in the above computation models, to appear only in regions surrounding the respective ends of the slit where the intensity of the optical near-field falls, it is necessary to form periodic recesses/projections only in the vicinity of each of the ends of the slit of the mask. When the refractive index of the base material of the photoresist that is tightly adhering to the mask is not one, as used in the above-described numerical computation models but n, it is necessary to multiply the above-cited pitch $\Lambda$ of the arrangement of periodic recesses/projections by $1/n$ to obtain $\Lambda/n$.

In this way, it is possible to obtain a distribution of an intensity that approximately reflects the shape of the slit, and hence, to form a resist pattern that approximately reflects the shape of the slit, by appropriately controlling the optical near-fields intensity distribution, using a photomask on which the pitch and/or the phase of the periodically arranged recesses are appropriately selected. While periodic recesses/ projections are formed only on the surface of the metal film that is irradiated with light in the above description, periodic recesses/projections may alternatively be formed on the front surface of the mask, although the effect will be weakened to a certain extent. Still, alternatively, periodic recesses/projections may be formed on the opposite surfaces of the metal film.

While recesses are formed in the above-described instance, it may be needless to say that a similar effect is obtained by forming periodic projections.

Figure 2:
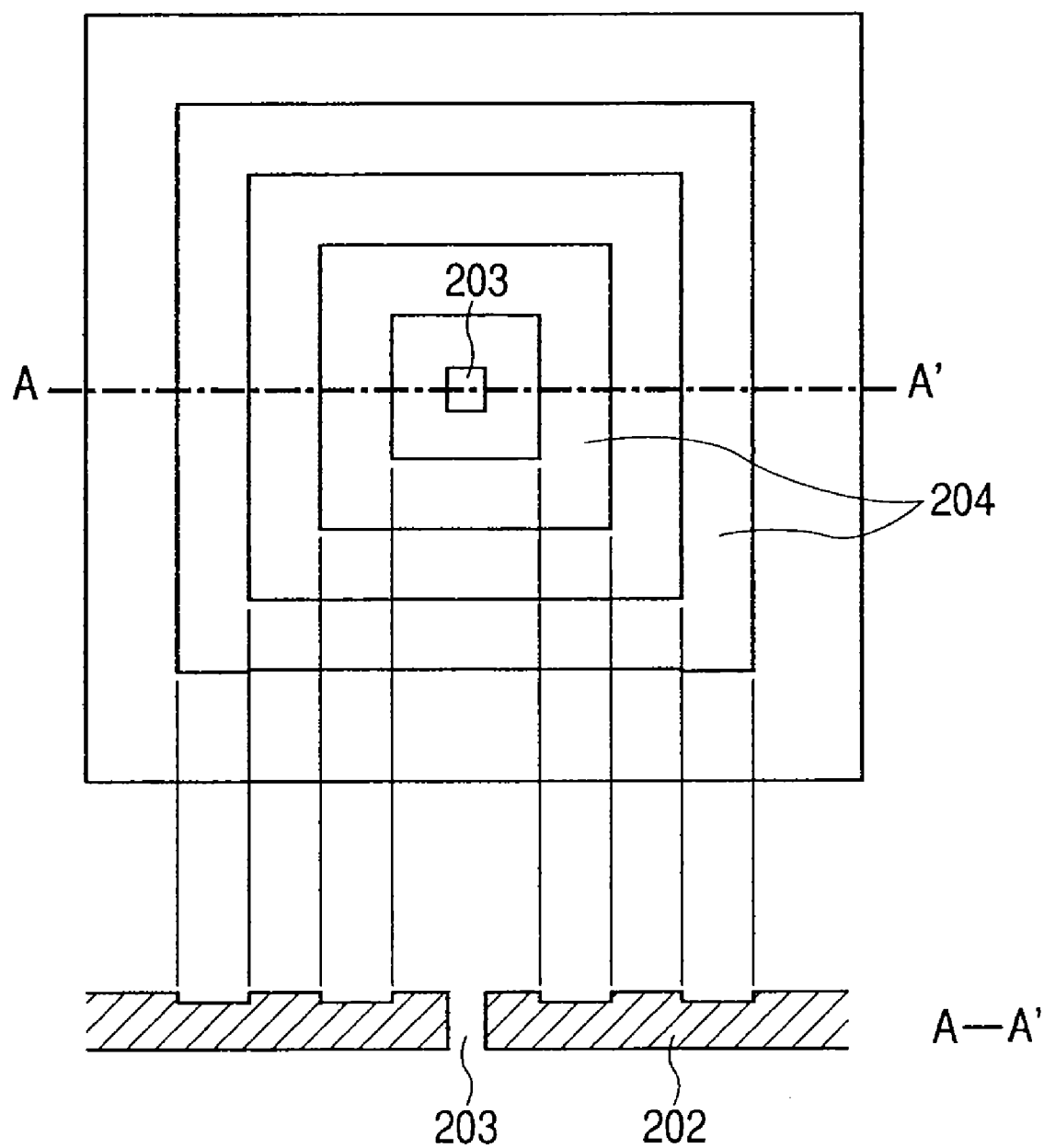
FIG. 2 is a schematic illustration of a photomask for exposure to an optical near-field obtained by modifying the first embodiment of the invention.

FIG. 2 shows a modified arrangement of periodic recesses, where square recesses are formed around a single micro-aperture to obtain a mask pattern that can effectively increase the optical near-field intensity due to the arrangement of the periodic recesses.

Second Embodiment

Figure 3:
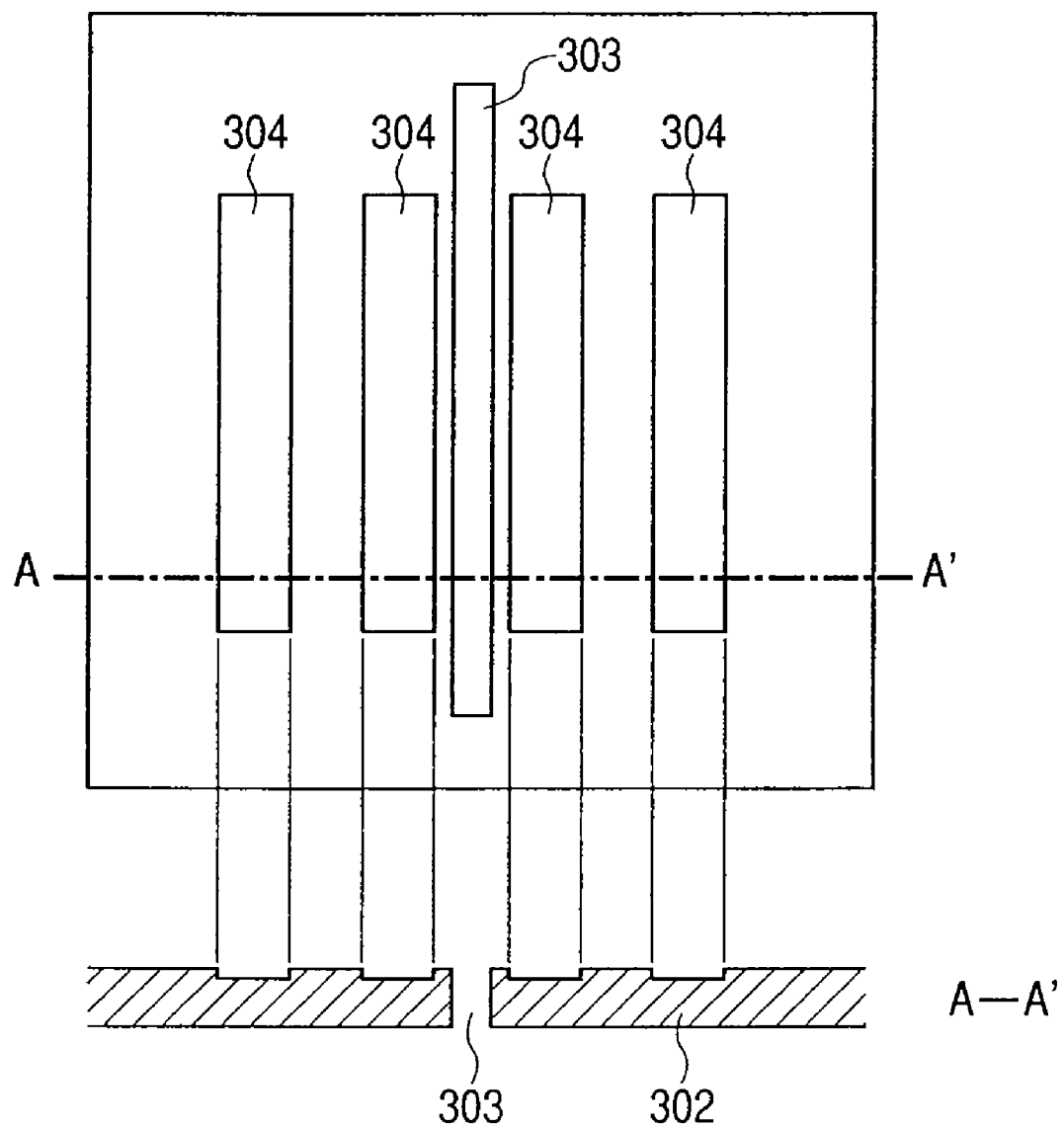
FIG. 3 is a schematic illustration of the second embodiment of a photomask for exposure to an optical near-field according to the invention.

FIG. 3 is an enlarged partial view of the second embodiment of a photomask for exposure to an optical near-field, according to the invention. With this embodiment, the intensity of an optical near-field can be reduced by means of periodic recesses for the purpose of controlling the intensity of the optical near-field.

The mask pattern of FIG. 3 is formed by arranging periodic recesses 304 in the vicinity of a middle part of slit-shaped aperture 303, where the intensity of the optical near-field is high. In this case, both the intensity of light propagated through the slit and that of the optical near-field on the surface of the mask are reduced by shifting the pitch and the phase of the periodic recesses 304.

With this arrangement again, it is possible to control the optical near-field intensity distribution in the vicinity of the slit and to obtain an exposure pattern that approximately reflects the shape of the slit.

In a case of controlling the optical near-field intensity distribution not only for a single slit, but the respective optical near-field intensity distributions for a plurality of slits whose shapes may vary from each other, so as to obtain a resist pattern, as the whole mask pattern, having a desired profile, the use of such a pattern that can reduce the intensity of the optical near-field is effective.

Third Embodiment

Figure 4:
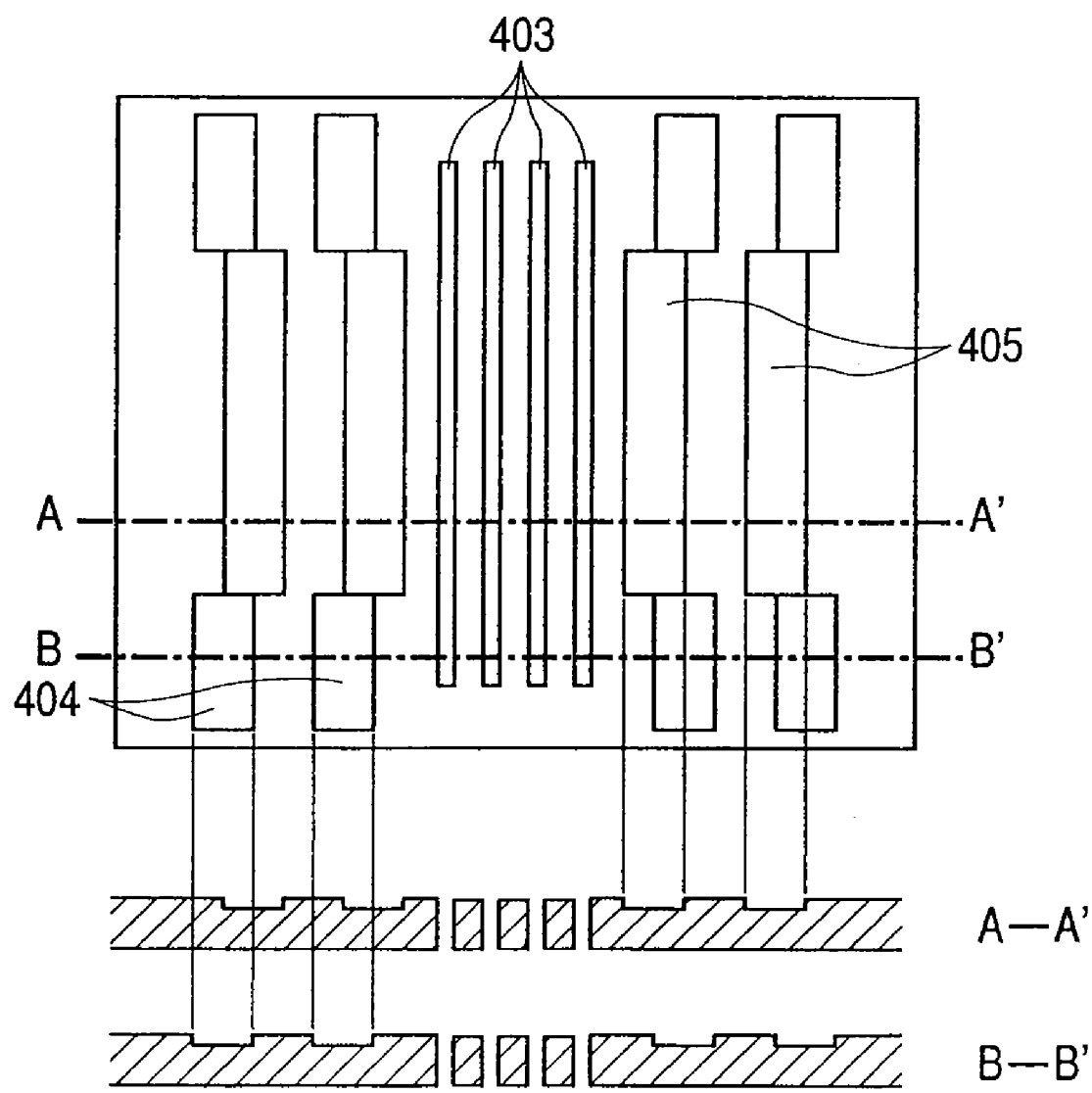
FIG. 4 is a schematic illustration of the third embodiment of a photomask for exposure to an optical near-field according to the invention.

FIG. 4 is an enlarged partial view of the third embodiment of a photomask for exposure to an optical near-field according to the invention. With this embodiment, the intensity of the optical near-field can be reduced in certain regions and, at the same time, increased in other regions on the mask by using a plurality of micro-apertures.

The mask pattern illustrated in FIG. 4 is formed by arranging a group of slit-shaped apertures 403 that run in parallel with each other. Recesses 404 are arranged periodically in the vicinity of each of the ends of the group of slit-shaped apertures 403 for the purpose of intensifying an optical near-field, whereas recesses 405 are arranged periodically in the vicinity of a central part of the group of slits for the purpose of reducing the intensity of an optical near-field.

With the periodic arrangement of recesses, it is possible to control not only the optical near-field intensity distribution in a single slit, but also, the difference in the intensities of an optical near-field among the plurality of slits, so as to expose a resist pattern that corresponds to the shapes of the slit to light.

Now, the present invention will be described further by way of examples.

EXAMPLE 1

Figure 8:
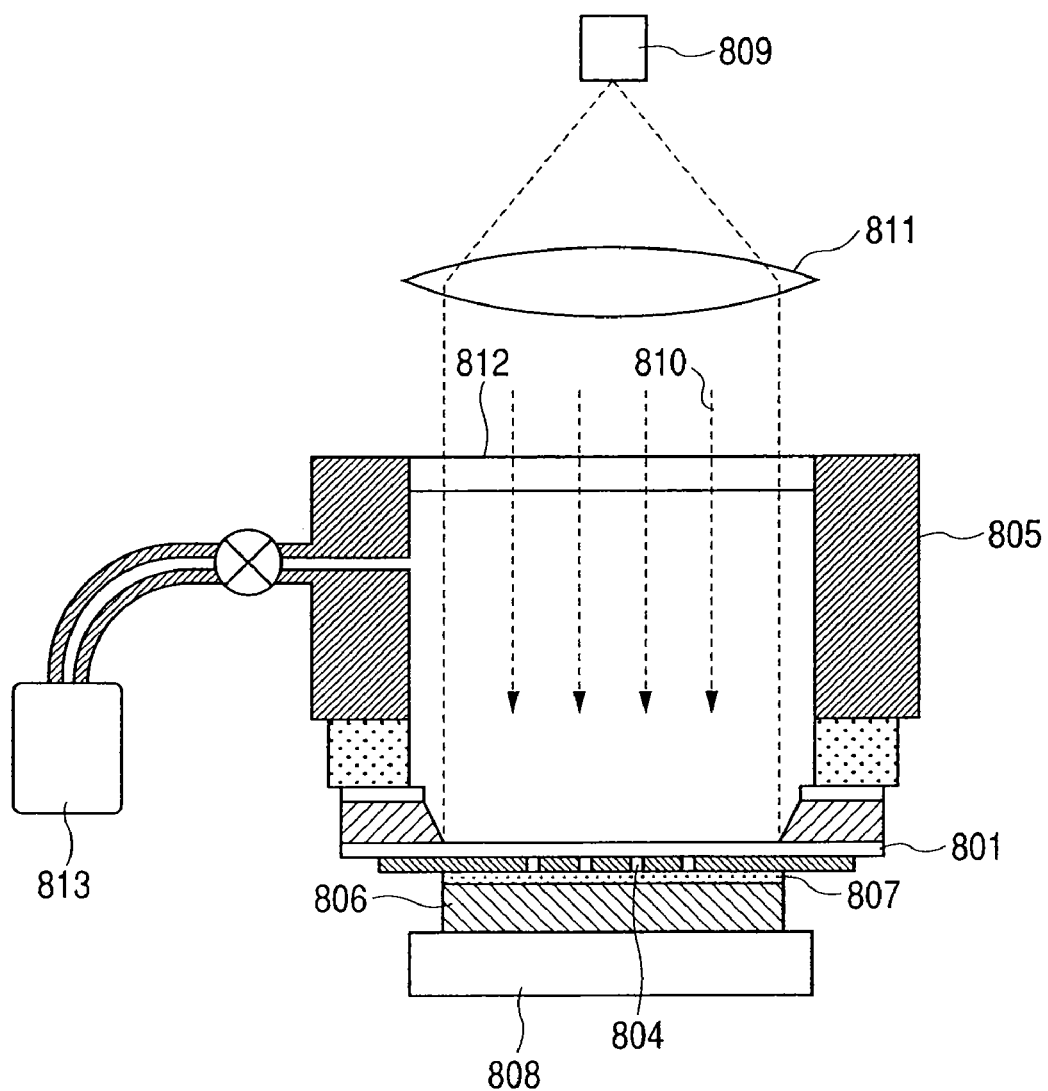
FIG. 8 is a schematic illustration of the pattern preparing apparatus used in Example 1.

FIG. 8 is a schematic illustration of the pattern preparing (exposure) apparatus used in Example 1.

In FIG. 8, reference symbol 801 denotes a photomask according to the invention as described above by way of embodiments. The front surface (the lower surface shown in FIG. 8) of the photomask 801 is directed to the outside of pressure adjustable container 805, whereas the rear surface (the upper surface shown in FIG. 8) of the photomask 801 is directed to the inside of the pressure adjustable container 805. The internal pressure of the pressure adjustable container 805 can be adjusted by a pressure adjusting means 813.

The object of exposure in this example was a substrate 806 carrying a resist film 807 that was formed on the surface thereof. The resist 807/substrate 806 was placed on a stage 808 and the stage 808 was driven so as to align the substrate 806 relative to the photomask 701 in intra-planar two-dimensional directions of the mask. Subsequently, the stage 808 was driven in a direction along the normal line relative to the mask surface so as to make the photomask 801 tightly adhere to the resist 807 on the substrate 806.

Then, the evanescent light exposure mask 801 was made to tightly adhere to the resist 807 on the substrate 806 by adjusting the internal pressure of the pressure adjustable container 805 by the pressure adjusting means 813 until the gap between the front surface of the mask 801 and the corresponding surface of the resist 807 became not greater than 100 nm over the entire surface area of the mask 801.

Thereafter, light for exposure 810 emitted from light source 809 was collimated by a collimator lens 811, and then made to pass through a glass window 812 so as to be introduced into the pressure adjustable container 805 and irradiated onto the evanescent light exposure mask 801 from the rear surface thereof (upper surface in FIG. 8). The resist 807 was exposed to an optical near-field produced in the vicinity of the micro-apertures on the front surface of the photomask 801. It was possible to transfer the different patterns 804 on the photomask on the substrate 806 as patterns of clear contrast by using the photomask 801.

EXAMPLE 2

FIGS. 9A through 9D are schematic illustrations of the pattern preparing method including a single buffer layer used in Example 2.

Figure 9A:
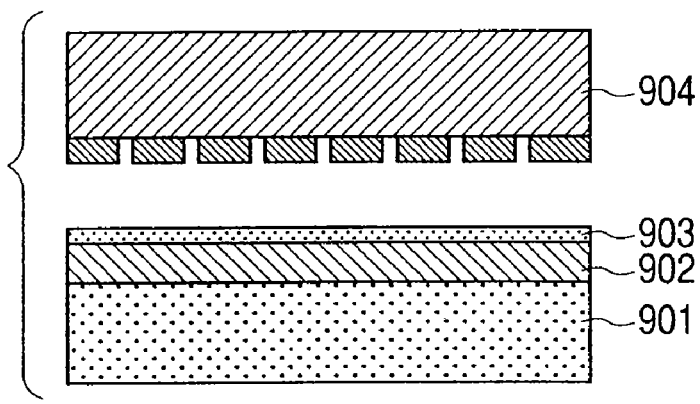
FIGS. 9A, 9B, 9C and 9D are schematic illustrations of the pattern preparing method used in Example 2.

FIG. 9A shows the photomask and the object of exposure of this example. The photomask 904 is a photomask according to the invention as described above by way of the embodiments.

In this example, a positive type photoresist was applied onto an Si substrate 901 by means of a spin coater. Subsequently, the photoresist was heated at 120° C. for thirty minutes to produce the first layer 902, which had a film thickness of 700 nm.

Thereafter, a negative type photoresist that contained Si was applied onto the first layer 902 and pre-baked to produce the second layer 903, which had a film thickness of 40 nm. Thus, the photoresist had a two-layered structure.

Then, the Si substrate 901 carrying the two-layered photoresist thereon, which was formed as a result of the application process, was brought close to the photomask 904 by means of the exposure apparatus as shown in FIG. 8, and pressure was applied thereto in order to make the resist layer 903 tightly adhere to the photomask 904.

Figure 9B:
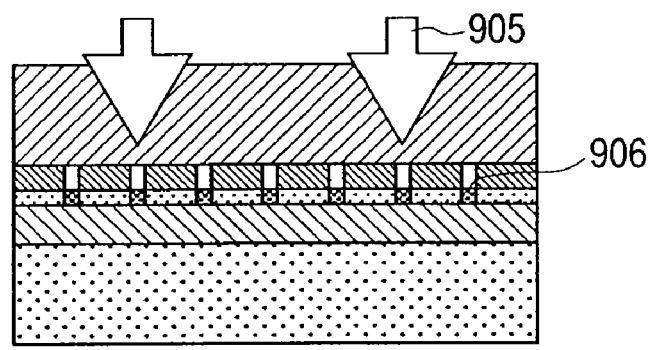

Light for exposure 905 (the photomask was prepared to meet the wavelength of light) was irradiated onto the photoresist layer 903 on the substrate 901 by way of the photomask. In other words, the photoresist layer 903 was exposed to light by way of the patterns on the photomask 904 (FIG. 9B).

Figure 9C:
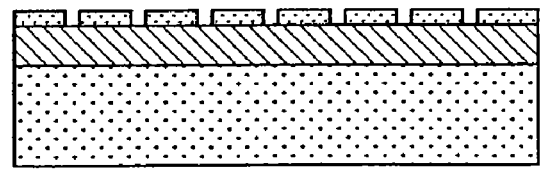

Subsequently, the photomask was removed from the surface of the photoresist layer 903, which was then subjected to a development process and a post-baking process. As a result, the patterns on the photomask were transferred as resist patterns (FIG. 9C).

Figure 9D:
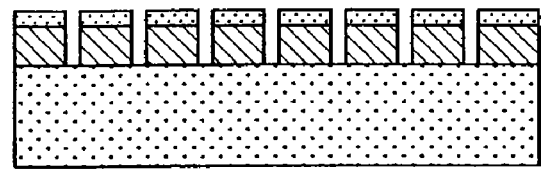

Thereafter, the first photoresist layer 902 was subjected to an oxygen reactive ion etching process, using the patterns formed on the second photoresist layer 903 as an etching mask (FIG. 9D).

The Si contained in the second photoresist layer 903 was oxidized in the oxygen reactive ion etching process to raise the etching-resistance of the layer.

As a result of following the above-described procedure, it was possible to transfer the different patterns on the photomask on the substrate 901 as patterns of clear contrast.

As many apparently widely different embodiments of the present invention can be made without departing from the spirit and scope thereof, it is to be understood that the invention is not limited to the specific embodiments thereof except as defined in the claims.

What is claimed is:

1. A resist pattern forming method comprising:
    (a) preparing a photomask for generating near-field light, the photomask comprising:
        (i) a light-transmissible base member; and
        (ii) a light-blocking film provided on the base member, the film having a micro-aperture adapted to expose an object to near-field light seeping out from the micro-aperture, the photomask having a periodic structure comprising the micro-aperture at an axis of symmetry and recesses or projections with a pitch, and a shift of a phase, wherein the shift of the phase exists between the recesses or projections adjacent to the micro-aperture, and wherein an intensity distribution of the near field light is controlled by way of the pitch and an extent of the shift of the phase of the periodic structure so that a difference in the intensity distribution of the near-field light in the area of the aperture is reduced;
    (b) arranging the photomask close to a photoresist film on a substrate;
    (c) irradiating light from a light source onto the photoresist film by way of the photomask to form a latent image based on the micro-aperture of the photomask; and
    (d) developing the photoresist film to form a resist pattern on the substrate based on the latent image.

2. A resist pattern forming method according to claim 1, wherein a buffer resist layer is interposed between the photoresist film and the substrate.

3. A resist pattern forming method according to claim 2, wherein the photoresist film contains silicon.

4. A resist pattern forming method according to claim 2, wherein the buffer resist layer is subjected to an etching process using the resist pattern of the photoresist film as an etching mask.

* * * * *